United States Patent
Hoberman et al.

(10) Patent No.: US 7,227,383 B2
(45) Date of Patent: Jun. 5, 2007

(54) LOW LEAKAGE AND DATA RETENTION CIRCUITRY

(75) Inventors: Barry A. Hoberman, Cupertino, CA (US); Daniel L. Hillman, San Jose, CA (US); William G. Walker, Saratoga, CA (US); John M. Callahan, San Ramon, CA (US); Michael A. Zampaglione, San Jose, CA (US); Andrew Cole, Sunnyvale, CA (US)

(73) Assignee: Mosaid Delaware, Inc., Sunnyvale, CA (US)

( * ) Notice: Subject to any disclaimer, the term of this patent is extended or adjusted under 35 U.S.C. 154(b) by 59 days.

(21) Appl. No.: 11/041,687

(22) Filed: Jan. 20, 2005

(65) Prior Publication Data

US 2005/0184758 A1    Aug. 25, 2005

Related U.S. Application Data

(60) Provisional application No. 60/586,565, filed on Jul. 9, 2004, provisional application No. 60/546,574, filed on Feb. 19, 2004.

(51) Int. Cl.
H03K 19/00    (2006.01)
(52) U.S. Cl. .................................... 326/93; 326/112
(58) Field of Classification Search ............ 326/93–98, 326/46, 104, 112, 119, 121
See application file for complete search history.

(56) References Cited

U.S. PATENT DOCUMENTS

| | | | |
|---|---|---|---|
| 5,023,480 A | 6/1991 | Gieseke et al. | |
| 5,528,173 A | 6/1996 | Merritt et al. | |
| 5,952,865 A | 9/1999 | Rigazio | |
| 5,963,054 A | 10/1999 | Cochran et al. | |
| 6,043,698 A | 3/2000 | Hill | |
| 6,208,171 B1 | 3/2001 | Kumagai et al. | |
| 6,246,265 B1 * | 6/2001 | Ogawa ...................... | 326/95 |
| 6,288,591 B1 | 9/2001 | Riccio | |
| 6,307,233 B1 | 10/2001 | Awaka et al. | |
| 6,384,639 B1 | 5/2002 | Chen et al. | |
| 6,414,534 B1 | 7/2002 | Wang et al. | |

(Continued)

OTHER PUBLICATIONS

Roy, K. et al., "Leakage Current Mechanisms and Leakage Reduction techniques in Deep-Submirometer CMOS Circuits," Proceedings of the IEEE, Feb. 200, pp. 305-327, vol. 91, No. 2, IEEE.

(Continued)

*Primary Examiner*—Don Le
(74) *Attorney, Agent, or Firm*—Carr & Ferrell LLP

(57) ABSTRACT

An integrated circuit includes first circuitry and sleep transistor circuitry. The first circuitry receives input signals and processes the input signals. The first circuitry also retains data in a sleep state that has low leakage. The sleep transistor circuitry is coupled to the first circuitry and receives a sleep signal that has a negative voltage. The sleep circuitry reduces power consumption of the first circuitry in the sleep state to have low leakage based on the sleep signal while retaining the data in the first circuitry.

16 Claims, 11 Drawing Sheets

U.S. PATENT DOCUMENTS

| | | |
|---|---|---|
| 6,437,623 B1 * | 8/2002 | Hsu et al. .................. 327/202 |
| 6,437,627 B1 | 8/2002 | Tran et al. |
| 6,522,171 B2 * | 2/2003 | Hanson et al. ............... 326/95 |
| 6,552,601 B1 | 4/2003 | Burr |
| 6,621,306 B2 * | 9/2003 | Ooishi et al. .............. 326/119 |
| 6,624,687 B1 | 9/2003 | Burr |
| 6,864,718 B2 | 3/2005 | Yu |
| 6,998,895 B2 * | 2/2006 | Uvieghara ................. 327/202 |
| 2004/0039954 A1 | 2/2004 | White et al. |

OTHER PUBLICATIONS

U.S. Appl. No. 10/840,893, filed May 7, 2004, Barry Alan Hoberman, Managing Power on Integrated Circuits Using Power Islands.

U.S. Appl. No. 10/996,739, filed Nov. 24, 2004, Randy J. Caplan, Systems and Methods for Minimizing Static Leakage of an Integrated Circuit.

\* cited by examiner

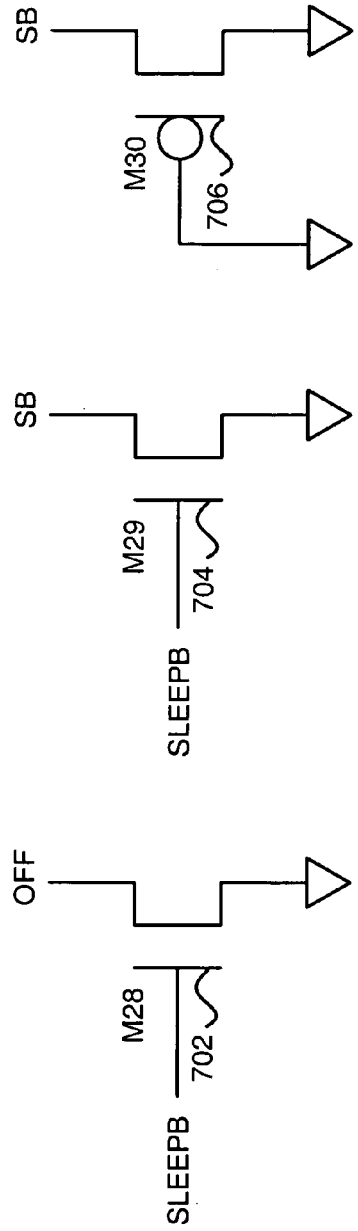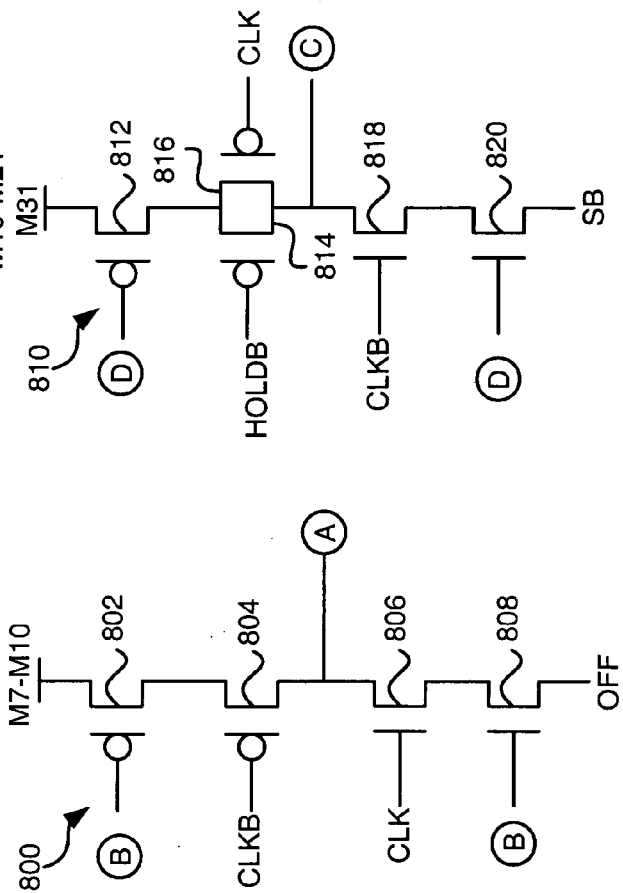

LOW LEAKAGE AND DATA RETENTION CIRCUITRY

CROSS-REFERENCE TO RELATED APPLICATIONS

This application claims the benefit of U.S. Provisional Application Ser. No. 60/546,574 titled "Power Management and Power Savings in Integrated Circuits," filed Feb. 19, 2004, which is hereby incorporated by reference. This application also claims the benefit of U.S. Provisional Application Ser. No. 60/586,565 titled "Systems and Methods for I/O Power Island Management and Leakage Control on Integrated Circuits," filed Jul. 9, 2004, which is hereby incorporated by reference.

BACKGROUND

1. Field of the Invention

The present invention relates generally to integrated circuits, and more particularly to low leakage and data retention circuitry.

2. Description of the Prior Art

Most integrated circuits have a design goal to reduce the overall power consumption. The total power consumed by an integrated circuit includes dynamic power consumption and standby leakage current consumption. The challenge in designing an integrated circuit is to reduce the dynamic power and leakage power, while maintaining performance and cost goals for the integrated circuit.

In complementary metal oxide semiconductors (CMOS), various types of leakage occur such as pn junction reverse-bias current, subthreshold leakage, oxide tunneling current, gate current due to hot-carrier injection, gate-induced drain leakage, and channel punchthrough current. When the threshold voltage for a CMOS transistor is reduced for higher performance, the leakage power is significant in the total power consumption of the CMOS circuit.

There are two approaches in reducing the leakage power for CMOS circuits. The first approach is a process level technique that controls the doping profile of the transistor. The other approach is a circuit level technique where voltages at the different device terminals such as the drain, source, gate, and body are controlled. Some circuit level techniques are discussed below.

One circuit level technique is stacking transistors, which is also called self-reverse bias. When more than one transistor in a stack of series-connected transistors is turned off, the subthreshold leakage current is reduced. One problem with the transistor stack is that only a three times reduction in leakage current is achieved.

Another circuit level technique is a multiple threshold voltage design. Both high- and low-threshold transistors are on the same chip to deal with the leakage problem. The high-threshold transistors suppress the sub-threshold leakage current. The low-threshold transistors are used to achieve higher performance. One problem with a multiple threshold design is that process complexity and costs are increased.

Another circuit level technique is a multiple body bias in which the body voltage is changed to modify the threshold voltage. If separate body biases are applied to different NMOS transistors, the transistor cannot share the same well, which requires triple well technologies. One problem is that well biasing consumes a lot of chip area and requires extra power supplies for each cell. This technique also increases process complexity and the leakage reduction is not optimal.

Another technique for reducing leakage is a sleep transistor. FIG. 1 depicts prior art circuitry including a sleep transistor. For NMOS sleep transistors, one or more NMOS transistors are added to logic gates in series with the cell transistors to VSS. The NMOS sleep transistors act as a switch to turn on and off the logic gate. In FIG. 1, the sleep transistor 130 is turned on (gate to VDD) during normal cell operation. When the cell is idle, the sleep transistor 130 is turned off (gate tied to VSS) to reduce the leakage current of the cell. Sleep transistors can also be PMOS transistors. One problem with sleep transistors is that if all logic has sleep transistors, the logic will lose their state information.

SUMMARY OF THE INVENTION

The invention addresses the above problems by providing systems and methods for low leakage, data retention circuitry. An integrated circuit includes first circuitry and sleep transistor circuitry. The first circuitry receives input signals and processes the input signals. The first circuitry also retains data in a sleep state that has low leakage. The sleep transistor circuitry is coupled to the first circuitry and receives a sleep signal that has a negative voltage. The sleep circuitry reduces power consumption of the first circuitry in the sleep state to have low leakage based on the sleep signal while retaining the data in the first circuitry.

In some embodiments, the sleep signal indicates a power up state and the sleep transistor powers up the first circuitry based on the sleep signal. In some embodiments, the first circuitry receives a hold signal and retains the data based on the hold signal. In some embodiments, the first circuitry includes master latch circuitry and slave latch circuitry that retains the data in the powered down state.

BRIEF DESCRIPTION OF THE DRAWINGS

FIG. 7A is an illustration of a sleep transistor for an OFF node in an exemplary implementation of the invention;

FIG. 7B is an illustration of a sleep transistor for an SB node in an exemplary implementation of the invention;

FIG. 7C is an illustration of a moderate impedance transistor for an SB node in an exemplary implementation of the invention;

FIG. 8A is an illustration of circuitry for a tristate inverter in the master latch in an exemplary implementation of the invention;

FIG. 8B is an illustration of circuitry for a tristate inverter in the slave latch in an exemplary implementation of the invention;

DETAILED DESCRIPTION OF THE INVENTION

Figure 1:
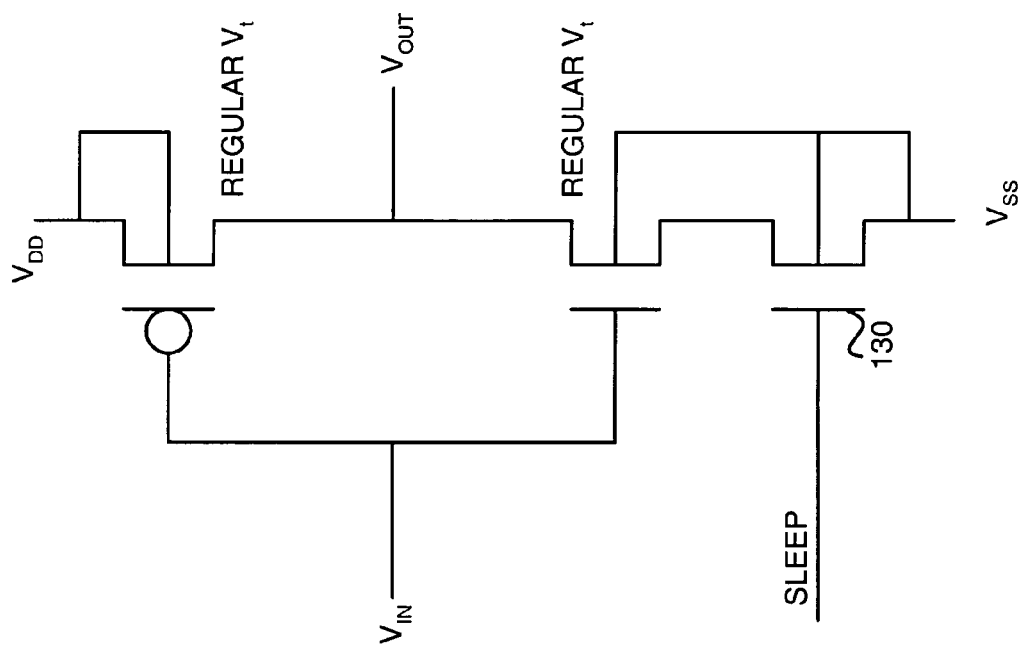
FIG. 1 is an illustration of circuitry including a sleep transistor in the prior art.

As shown in the exemplary drawings wherein like reference numerals indicate like or corresponding elements among the figures, exemplary embodiments of a system and method according to the present invention are described below in detail. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure, method, process or manner.

Figure 2:
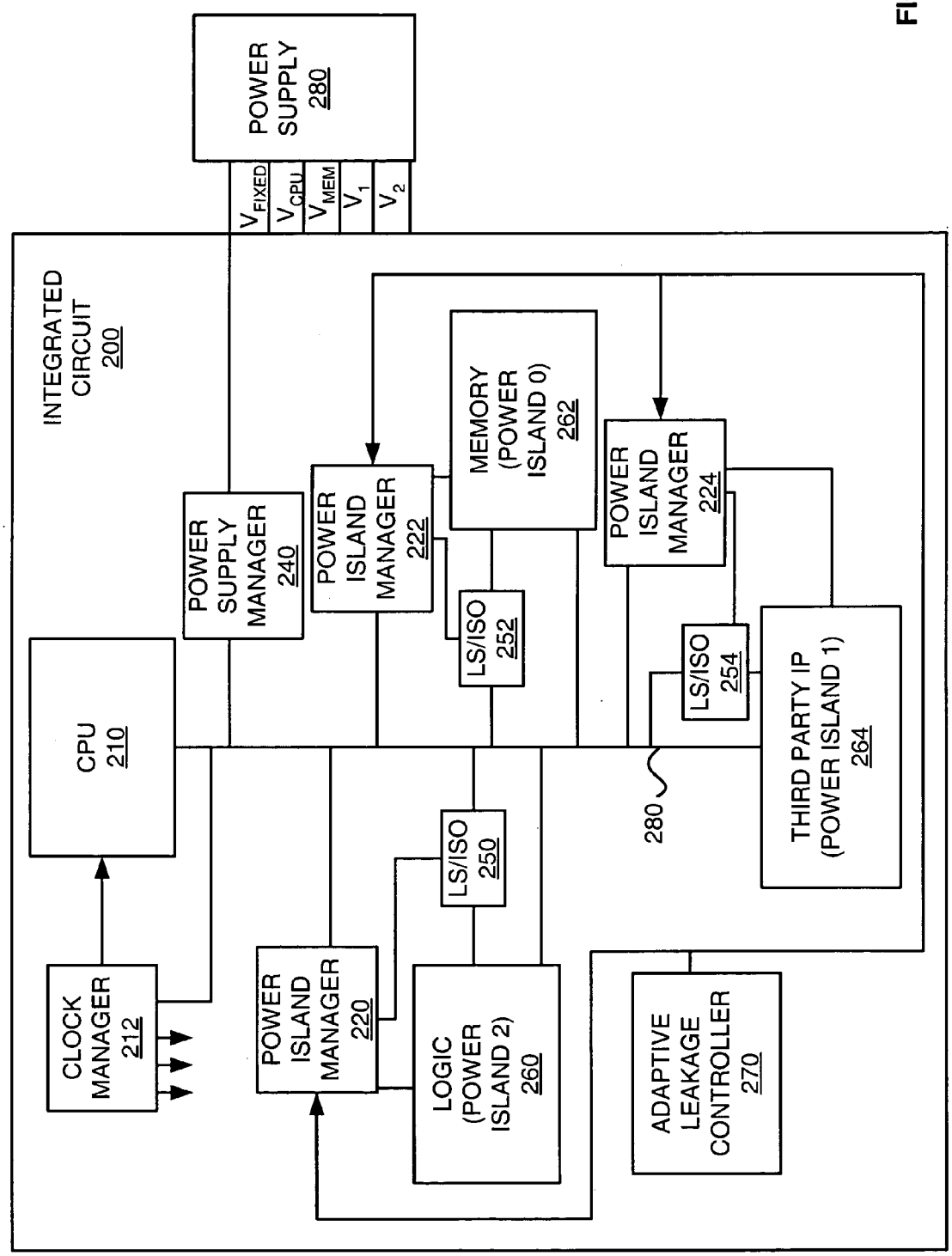
FIG. 2 is an illustration of an integrated circuit with a power supply in an exemplary implementation of the invention.
Figure 3:
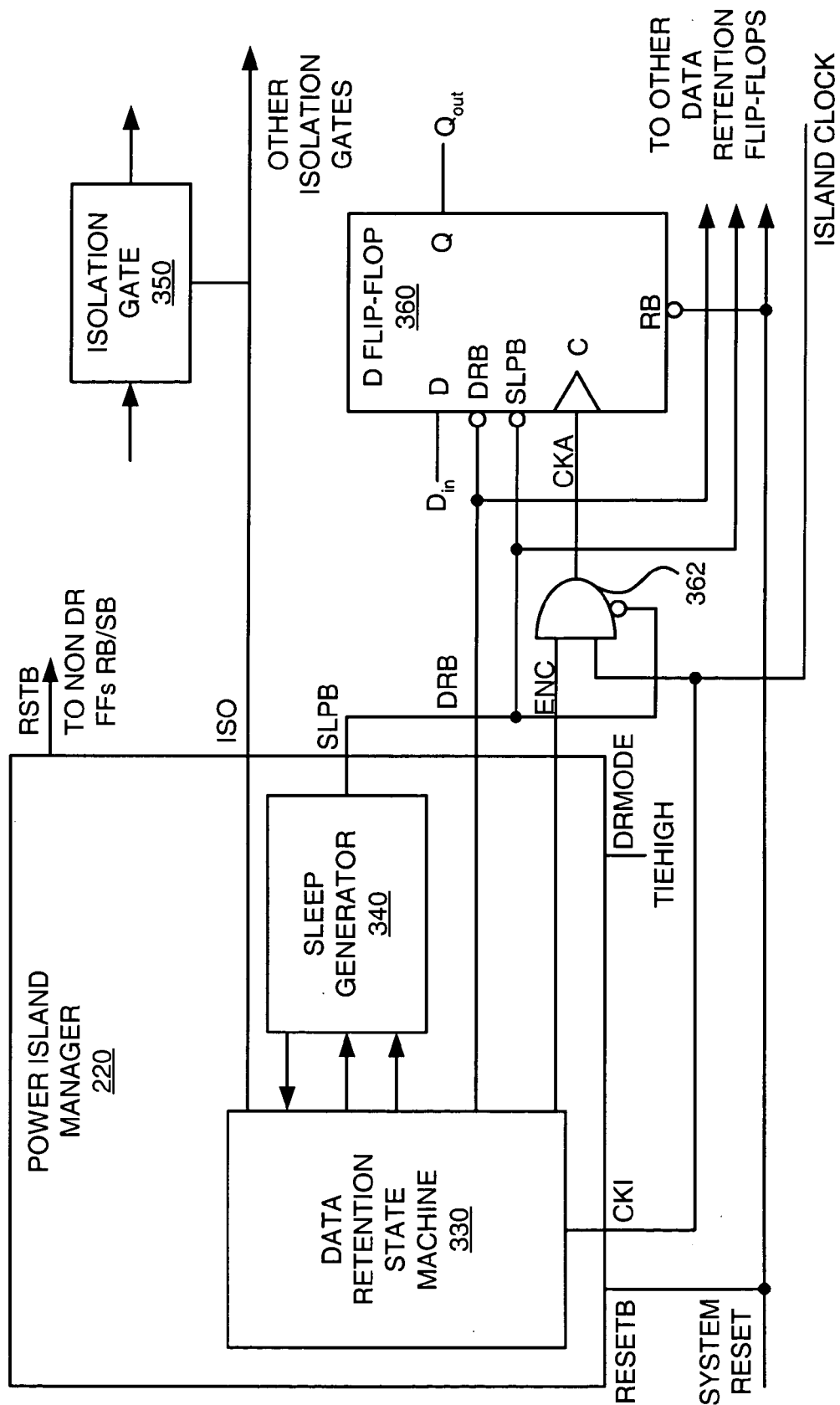
FIG. 3 is an illustration of a power island manager with an isolation gate and a D flip-flop in an exemplary implementation of the invention.
Figure 4:
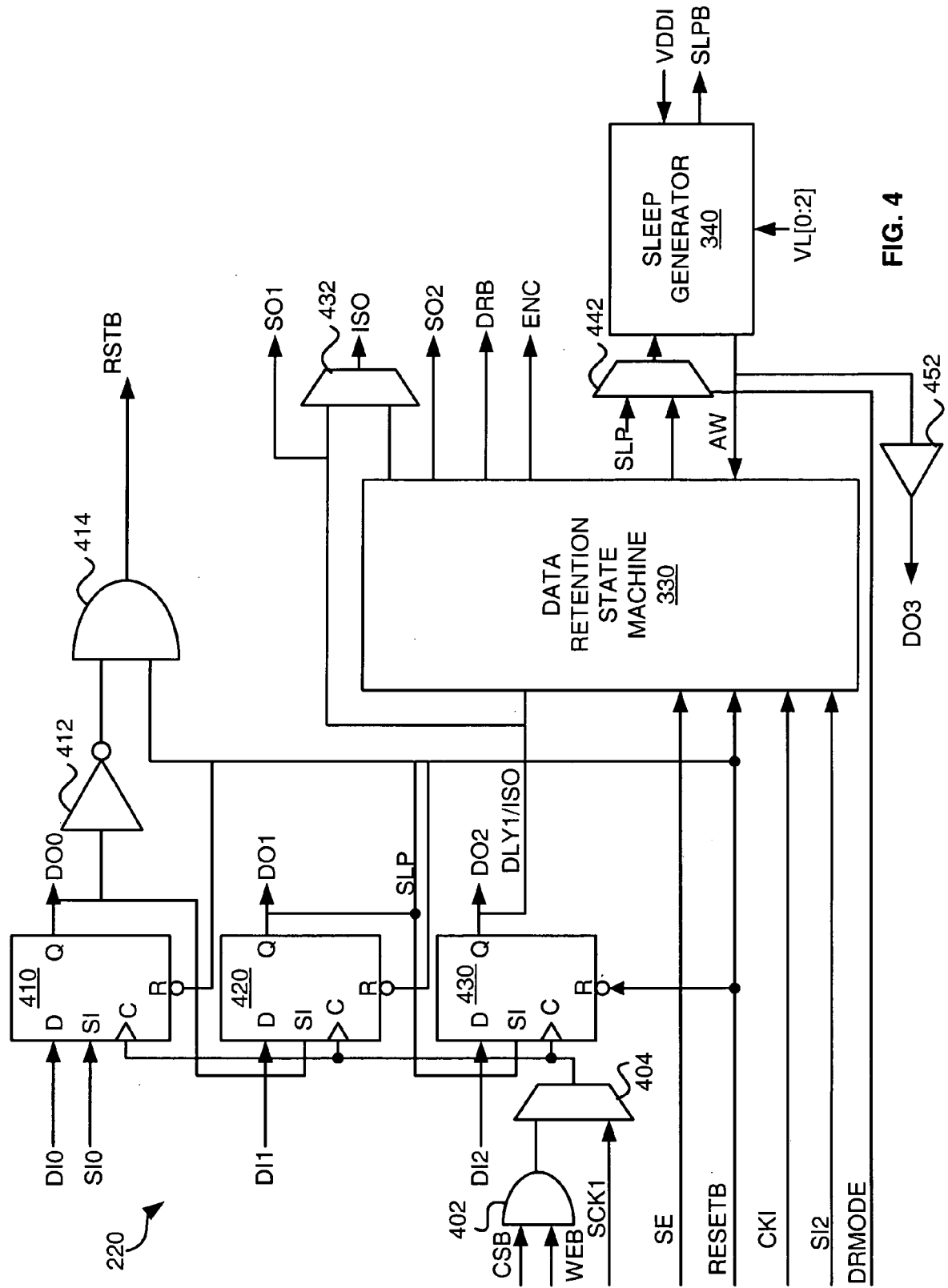
FIG. 4 is an illustration of a power island manager in an exemplary implementation of the invention.

Power Island Manager—FIGS. 2–4

In some embodiments, an integrated circuit can be delineated into power islands. Power consumption can then be controlled within the power island. A power island manager provides control signals to the power island to control power consumption of the power island. In some embodiments, the low leakage, data retention circuitry is located within the power islands.

FIG. 2 depicts an illustration of an integrated circuit 200 with a power supply 280 in an exemplary implementation of the invention. The integrated circuit 200 includes a central processing unit (CPU) 210, a clock manager 212, power island managers 220, 222, and 224, a power supply manager 240, level shifter/isolation gates (LS/ISO) 250, 252, and 254, logic (power island 2) 260, memory (power island 0) 262, third party intellectual property (IP) (power island 1) 264, adaptive leakage controller (ALC) 270, and bus 280.

A power island is any section, delineation, partition, or division of an integrated circuit where power consumption is controlled within the section, delineation, partition, or division. In some embodiments, the power islands are delineated based on geographic factors of the integrated circuit. In some embodiments, the power islands are delineated based on functional IP units of the integrated circuit 200. In this example depicted in FIG. 2, power islands are delineated by memory 262, logic 260, and third party IP 264. Power islands are discussed in further detail in pending U.S. application Ser. No. 10/840,893 entitled "Managing Power on Integrated Circuits Using Power Islands" filed on May 7, 2004, which is hereby incorporated by reference.

The power island managers 220, 222, and 224 are any circuitry, device, or system configured to provide control signals to a power island to control power within the power island. The power island managers 220, 222, and 224 can dynamically change the power consumption of the power islands based on the needs and operation of the integrated circuit 200. The power island managers 220, 222, 224 may select a clock, change clock frequency, or modify the voltage within the power island to control the power consumption of the power island.

The ALC 270 provides control signals to compensate for process and temperature variation to provide the optimum voltage to be applied to sleep transistors in the power islands. The ALC 270 is described in further detail U.S. patent application Ser. No. 10/996,739 entitled "Systems and Methods for Minimizing Static Leakage of an Integrated Circuit" filed on Nov. 17, 2004.

FIG. 3 depicts an illustration of the power island manager 220 with an isolation gate 350 and a D flip-flop 360 in an exemplary embodiment of the invention. The power island manager 220 includes a data retention state machine 330 and a sleep generator 340 that are coupled to each other.

The power island manager 220 is coupled to the isolation gate 350 by the ISO signal. The ISO signal is also coupled to other isolation gates. The data retention state machine 330 is coupled to DRB input of the D flip-flop 360 via the DRB signal. The data retention state machine 330 is also coupled to the AND gate 362 via the ENC signal. The clock island (CKI) signal is coupled to the data retention state machine 330 and the AND gate 362. The sleep generator 340 is coupled to the D flip-flop 360 and the AND gate 362 via the SLPB signal. The output of the AND gate 362 is coupled to the C input of the D flip-flop 360 via the CKA signal. The system reset signal is coupled to the RESETB input of the power island manager 220 and the RB input of the D flip-flop 360. The SLPB signal, the DRB signal, and the system reset signal are coupled to other data retention flip-flops.

FIG. 4 depicts an illustration of a power island manager 220 in an exemplary embodiment of the invention. The power island manager 220 includes an AND gate 402, a multiplexer (MUX) 404, a D flip-flop 410, an inverter 412, an AND gate 414, a D flip-flop 420, a D flip-flop 430, the data retention state machine 330, a MUX 432, a MUX 442, a sleep generator 340, and a buffer 452.

The DI0 pin is coupled to the D input of the D flip-flop 410. The SI0 pin is coupled to the SI input of the D flip-flop 410. The CSB and the WEB pins are coupled to the inputs of the AND gate 402. The output of the AND gate 402 and the SCK1 pin are coupled to the input of the MUX 404. The output of the MUX 404 is coupled to the C inputs of the D flip-flop 410, the D flip-flop 420, and the D flip-flop 430. The Q output of the D flip-flop 410 is coupled to the DO0 pin, which is coupled to the input of the inverter 412 and the SI input of the D flip-flop 420. The DI1 pin is coupled to the D input of the D flip-flop 420. The Q output of the D flip-flop 420 is coupled to the DO1 pin, which is coupled to the input of the AND gate 414 and the SI input of the D flip-flop 430. The output of the AND gate 414 is coupled to the RSTB pin. The DI2 pin is coupled to the D input of the D flip-flop 430. The Q output of the D flip-flop 430 is coupled to the DO2 pin, which is coupled to the DLY1/ISO pin. The DLY1/ISO pin is coupled to the SO1, the input of the MUX 432, and the data retention state machine 340.

The RESETB pin is coupled to the R input of the D flip-flop 430, the D flip-flop 420, and the D flip-flop 410. The SE pin, the RESETB pin, the CKI pin, and the SI2 pin are coupled to the data retention state machine 330. The data retention state machine 330 is coupled to the input of the MUX 432, the SO2 pin, the DRB pin, the ENC pin, and the input of the MUX 442. The output of the MUX 442, the VDDI pin, and the VL[0:2] are coupled to the sleep generator 340. The sleep generator 340 is coupled to the SLPB pin. The sleep generator 340 is coupled to the data retention state machine 330 via the AW pin and the input of the buffer 452. The output of the buffer 452 is coupled to the DO3 pin. The DRMODE pin is coupled to the MUX 442.

In operation, the power island manager 220 has a three bit register for controlling a power island for some embodiments. D [0], with input DI0 and output DO0, is an island reset for re-initializing a power island. This bit is combined with RESETB to form RSTB to re-initialize the power island whenever RESETB or the D [0] is active. D [1], with input DI1 and output DO1, is a sleep bit. When the D [1] bit is set to one, the power island goes into a low leakage state. D [2], with input DI2 and output DO2, is a DLY1/Isolate bit. When DRMODE is tied to low, the D [2] bit, when set to one, will add one clock cycle delay between DRB going active and SLPB going active. When DRMODE is tied high, the D [2] bit, when set to one, will activate isolation of the power island. D [3], such as DO3, is an awake bit. This D [3] bit goes high when SLPB is high. This can be used by software to determine when a power island is out of the sleep state.

The power island manager 220 has two operating modes: one that supports power islands with data retention flip-flops and one that does not. When the DRMODE pin is tied high, a power island is put to sleep by writing a one to D[1]. The data retention state machine 330 performs the timing. The isolate (ISO) signal goes active when the sleep bit is written to a one, and the enable clock (ENC) and the data retention (DRB) will go low after synchronization to the power island clock (CKI). One or two clock cycles later the sleep (SLPB) goes low. To come out of sleep mode, a zero is written to D[1]. In some embodiments, all clock buffers in the power islands can be put to sleep to further minimize leakage. Software can determine when the power island has come out of sleep by reading when DO3 is high.

The System Reset is typically applied once after initial system power up. In some embodiments, the System Reset goes to all data retention flip-flops. The System Reset signal and DI0 bar are combined in a logical AND (RSTB output) to provide initialization to non data retention flip-flops. To create a power island reset, D[0] is set to a one and then cleared to a zero by software.

When the DRMODE is tied low, the power island manager 220 can also provide the control signals for a power island without data retention flip-flops. The power island manager 220 may have a hardware driven method and a software driven method for interfacing to power islands without data retention flip-flops. The software sequence has the following sequence:

| | |
|---|---|
| Write 04 | /turn on isolation |
| Write 06 | /turn on sleep, isolation on /come out of sleep |
| Write 05 | /turn sleep off, reset island, isolation on /wait for sleep to go high |
| Read | /test for DO3 = 1; sleep is high |
| Write 00 | /turn isolation off, normal operation |

The hardware driven method uses a clock to sequence the state machine. The only action software takes is to write the sleep bit (DI1) to a one to go into sleep and write a zero to the sleep bit to go out of sleep. Software can determine when the island has come out of sleep by reading when DO3 is high.

In some embodiments, the power island manager 220 contains two scan chains because some of the flip-flops are clocked on the positive and some on the negative. The scan chain enable pin switches the clock on scan chain 1 (SI1 is the input; SO1 is the output), the registers, to CKS1. Scan chain 2 (SI2 is the input; SO2 is the output) is connected to the data retention state machine 330 flip-flops that are clocked on the negative edge of CKI. A separate scan out is provided for each clock domain.

In some embodiments, the SLPB net uses p-type antenna diodes. Since the SLPB net may go to a negative voltage, an n-type antenna diode can cause excessive leakage to ground. The leakage can cause SLPB not to go negative and may not work properly. The CSB pin is a chip select pin. The WEB pin is the write enable pin. The VL [2:0] is the leakage control voltage value set by the ALC 270 (FIG. 2). The VDDI is the VDD from the power island.

Low Leakage, Data Retention Circuitry—FIGS. 5, 6, 7A–C, 8A–8B, and 9–12

FIGS. 5, 6, 7A–C, and 8A–8B disclose one embodiment for low leakage, data retention circuitry. In this embodiment, in sleep mode, the circuit parts of a flip-flop that do not require data retention are coupled to ground through a sleep transistor. The gate of the sleep transistor is coupled to a sleep signal that can be driven to a negative voltage such as −0.3V. Thus, the leakage in these circuit parts of the flip-flop is eliminated (reduced). When not in a sleep state, the sleep transistor has a gate value equal to or greater than the VDD supply, which effectively grounds the circuit.

The circuit parts that require data retention are coupled to ground through two transistors. One transistor acts effectively to ground the circuit above when not in sleep mode just as the sleep transistor described above. The other transistor is a PMOS device with the gate tied to ground, which provides medium impedance to ground. The voltage drop across this transistor acts to reduce the leakage by increasing the source bias of the NMOS transistors and simultaneously reduces the voltage across the circuit. In this embodiment, the data is retained in a sleep state and reduces the leakage by a factor of 22.

Figure 5:
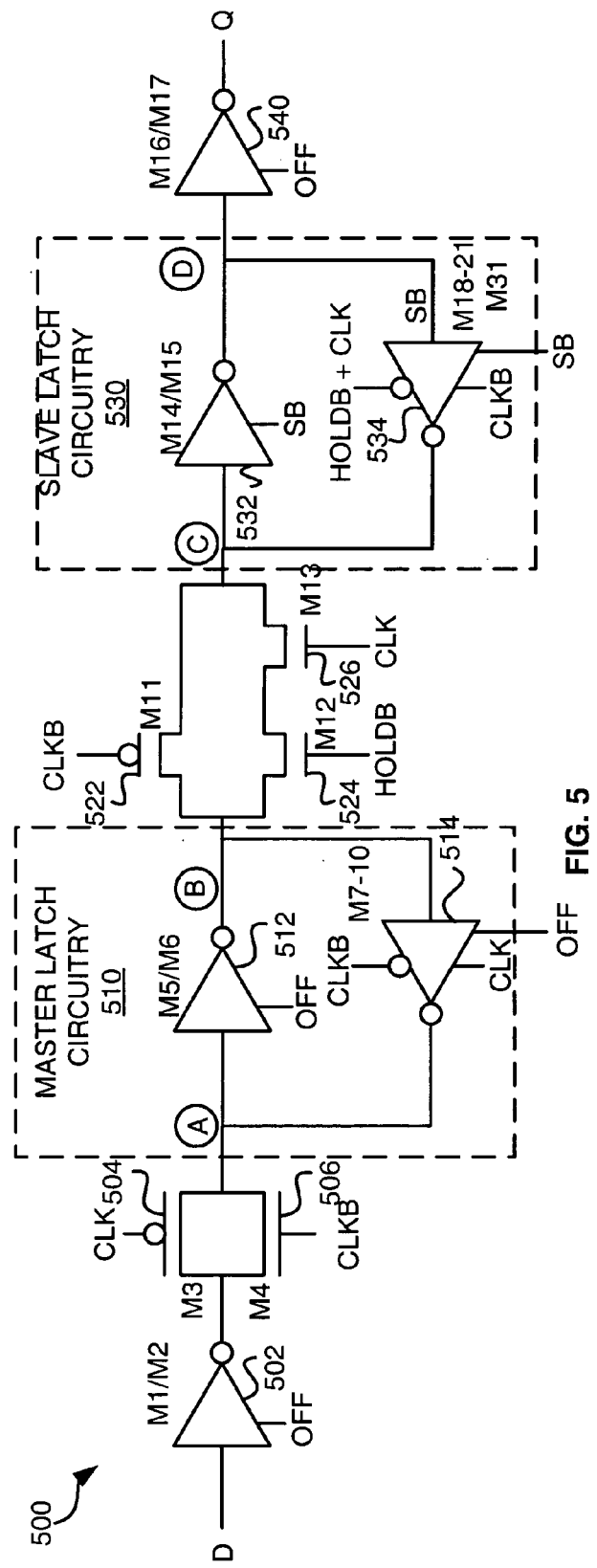
FIG. 5 is an illustration of a D/Q portion of flip-flop circuitry in an exemplary implementation of the invention.

FIG. 5 depicts an illustration of a D/Q portion 500 of the flip-flop circuitry in an exemplary implementation of the invention. The D/Q portion 500 of the flip-flop circuitry includes an inverter 502, a M3 PMOS transistor 504, an M4 NMOS transistor 506, master latch circuitry 510, an M11 PMOS transistor 522, an M12 NMOS transistor 524, an M13 NMOS transistor 526, slave latch circuitry 530, and an inverter 540.

The D signal input is the input of the inverter 502, which includes transistors M1 and M2. The source of the inverter 502 is coupled to the node OFF, which is described below in FIG. 7A. The output of the inverter 502 is coupled to the M3 PMOS transistor 504 and the M4 NMOS transistor 506. The gate of the M3 PMOS transistor 504 is coupled to the CLK signal input. The gate of the M4 NMOS transistor 506 is coupled to the CLKB signal input.

The master latch circuitry 510 includes the inverter 512 and the inverter 514. The inverter 514 forms a feedback loop with the inverter 512, where the output of the inverter 512 is coupled to the input of the inverter 514 and the output of the inverter 514 is coupled to the input of the inverter 512. The inverter 512 corresponds to transistor M5 and M6. The inverter 514 corresponds to transistors M7–M10. The input of the inverter 512 is coupled to node A, which is described in FIG. 8A below. The source of the inverter 512 is also coupled to node OFF, which is described below in FIG. 7A. The output of the inverter 512 is coupled to node B, which is described below in FIG. 8A. The source of the inverter 514 is coupled to node OFF, which is described below in FIG. 7A. The PMOS gate of the inverter 514 is coupled to the CLKB signal input. The NMOS gate of the inverter 514 is coupled to the CLK signal input.

The M11 PMOS transistor 522 is in parallel to the M12 NMOS transistor 524 and the M13 NMOS transistor 526, which are in series. The gate of the M11 PMOS transistor 522 is coupled to the CLKB signal input. The gate of the M12 NMOS transistor 524 is coupled to the HOLDB signal input. The gate of the M13 NMOS transistor 526 is coupled to the CLK signal input.

The slave latch circuitry 530 includes the inverter 532 and the inverter 534. The inverter 534 forms a feedback loop with the inverter 532, where the output of the inverter 532 is coupled to the input of the inverter 534 and the output of the inverter 534 is coupled to the input of the inverter 532. The inverter 532 corresponds to transistor M14 and M15. The inverter 534 corresponds to transistors M18–21 and M31. The input of the inverter 532 is coupled to node C, which is described in FIG. 8B below. The source of the inverter 532 is also coupled to node SB, which is described below in FIGS. 7B–C. The output of the inverter 532 is coupled to node D, which is described below in FIG. 8B. The source of the inverter 534 is coupled to node SB, which is described below in FIGS. 7B–C. The PMOS gates of the inverter 534 are coupled to the HOLDB and CLK signal inputs. The NMOS gate of the inverter 534 is coupled to the CLKB signal input.

The output of the inverter 532 is coupled to the input of the inverter 540. The inverter 540 corresponds to transistors M16 and M17. The source of the inverter 540 is also coupled to node OFF, which is described below in FIG. 7A. The output of the inverter 540 is the Q signal output.

Figure 6:
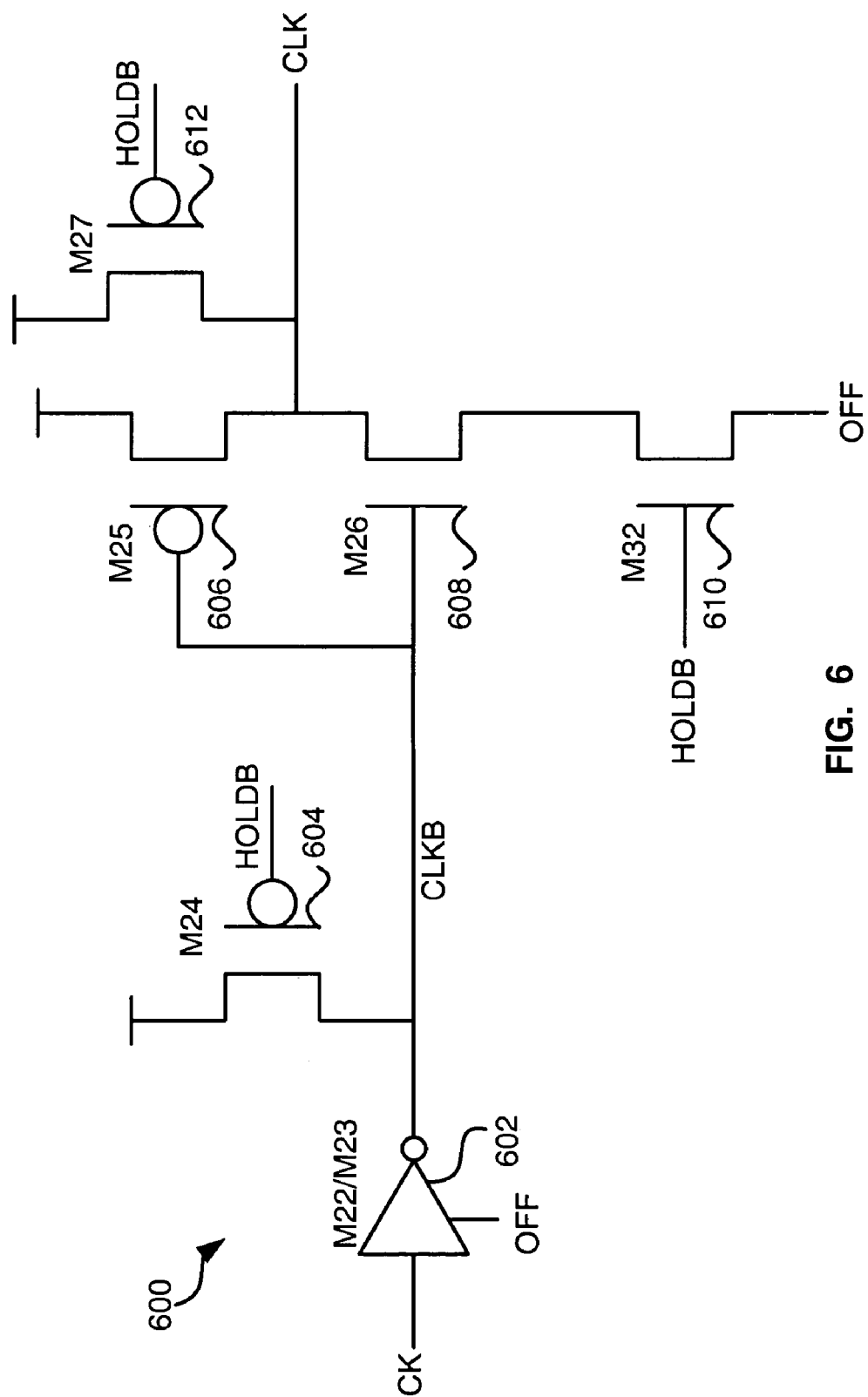
FIG. 6 is an illustration of a CK portion of flip-flop circuitry in an exemplary implementation of the invention.

FIG. 6 depicts a CK portion 600 of the flip-flop circuitry in an exemplary implementation of the invention. The CK portion 600 of the flip-flop circuitry includes an inverter 602, an M24 PMOS transistor 604, an M25 PMOS transistor 606, an M26 NMOS transistor 608, an M32 NMOS transistor 610, and an M27 PMOS transistor 612.

The CK signal input is the input of the inverter 602, which includes transistors M22 and M23. The source of the inverter 602 is coupled to node OFF, which is described below in FIG. 7A. The output of the inverter 602 is coupled to the drain of the M24 PMOS transistor 604 and the node CLKB. The gate of the M24 PMOS transistor 604 is coupled to the HOLDB signal input. The output of the inverter 602 is also coupled to the M25 PMOS transistor 606 and the M26 NMOS transistor 608. The M25 PMOS transistor 606, the M26 NMOS transistor 608, and the M32 NMOS transistor 610 are coupled in series. The gate of the M32 NMOS transistor 610 is coupled to the HOLDB signal input.

The CLK signal output is coupled to the drain of the M25 PMOS transistor 606, the drain of the M26 NMOS transistor 608, and the drain of the M27 PMOS transistor 612. The gate of the M27 PMOS transistor 612 is coupled to the HOLDB signal input.

FIG. 7A depicts a sleep transistor 702 for the OFF node in an exemplary implementation of the invention. The sleep transistor 702 is an NMOS transistor that corresponds to transistor M28. The drain of the sleep transistor 702 is coupled to the OFF node. The gate of the sleep transistor 702 is coupled to the SLEEPB signal input. The source of the sleep transistor 702 is coupled to ground. In some embodiments, the OFF node can be separated into two or more nodes each having its own NMOS sleep transistor.

FIG. 7B depicts a sleep transistor 704 for the SB node in an exemplary implementation of the invention. The sleep transistor 704 is an NMOS transistor that corresponds to transistor M29. The drain of the sleep transistor 704 is coupled to the SB node. The gate of the sleep transistor 704 is coupled to the SLEEPB signal input. The source of the sleep transistor 704 is coupled to ground.

FIG. 7C depicts a sleep transistor 706 for the SB node in an exemplary implementation of the invention. The sleep transistor 706 is a PMOS transistor that corresponds to transistor M30. The source of the sleep transistor 706 is coupled to the SB node. The gate and drain of the sleep transistor 706 are coupled to ground.

FIG. 8A depicts circuitry 800 for the tristate inverter in the master latch in an exemplary implementation of the invention. The circuitry 800 for the master latch includes a PMOS transistor 802, a PMOS transistor 804, an NMOS transistor 806, and an NMOS transistor 808 that are coupled together in series. The gates of the PMOS transistor 802 and the NMOS transistor 808 are coupled to the node B. The gate of the PMOS transistor 804 is coupled to the CLKB signal input. The gate of the NMOS transistor 806 is coupled to the CLK signal input. The drains of the PMOS transistor 804 and the NMOS transistor 806 are coupled to node A. The source of the NMOS transistor 808 is coupled to node OFF.

FIG. 8B depicts circuitry 810 for the tristate inverter in the slave latch in an exemplary implementation of the invention. The circuitry 810 for the slave latch includes a PMOS transistor 812, a PMOS transistor 814, a PMOS transistor 816, an NMOS transistor 818, and an NMOS transistor 820. The PMOS transistor 812 is coupled to the PMOS transistor 814 and the PMOS transistor 816 that are parallel to each other. The PMOS transistor 814 and the PMOS transistor 816 are coupled to the NMOS transistor 818, which is also coupled to the NMOS transistor 820.

The gates of the PMOS transistor 812 and the NMOS transistor 820 are coupled to the node D. The gate of the PMOS transistor 814 is coupled to the HOLDB signal input. The gate of the PMOS transistor 816 is coupled to the CLK signal input. The gate of the NMOS transistor 818 is coupled to the CLKB signal input. The drains of the PMOS transistor 814, the PMOS transistor 816, and the NMOS transistor 806 are coupled to node C. The source of the NMOS transistor 820 is coupled to node SB.

Figure 9:
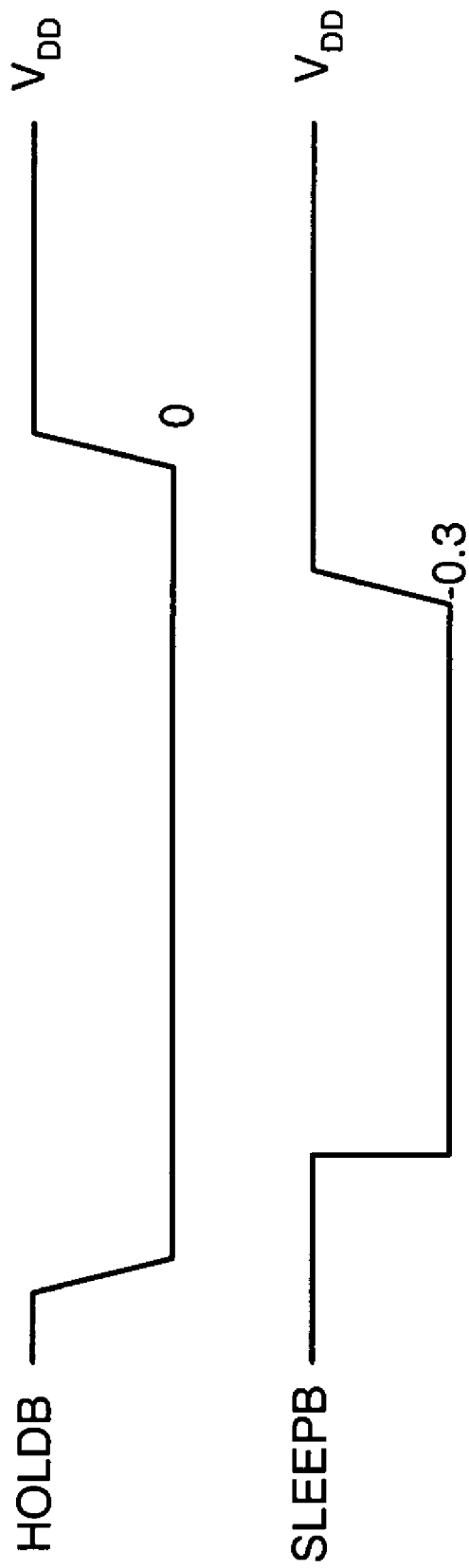
FIG. 9 is an illustration of a HOLDB and SLEEPB signals in an exemplary implementation of the invention.

FIG. 9 depicts an illustration of the HOLDB and SLEEPB signals in an exemplary embodiment of the invention.

The operation begins with CK going to zero. This causes CLKB to be equal to VDD and CLK to be equal to zero, which isolates the slave latch circuitry 530 from the master latch circuitry 510. The HOLDB signal goes to 0 to retain the state of the slave latch. The SLEEPB signal then goes to −0.3V. This shuts off transistor M28 in FIG. 7A, which halts the leakage from all the circuits except in the slave latch circuitry 530. When not in sleep mode, transistor M28 provides a low impedance path to ground.

The slave latch circuitry 530 is coupled to ground through the transistors M29 and M30, respectively depicted in FIGS. 7B and 7C. One purpose of transistor M29 is to provide a low impedance path to ground when not in sleep mode.

One purpose of transistor M30 is to provide a default moderate impedance path to ground when transistor M29 is off or in sleep mode. The leakage in the slave latch circuitry 530, in going through transistor M30, causes node SB to rise. This provides a source bias to the slave NMOS transistors reducing the leakage through them and also reduces the voltage across the slave side to VDD−SB, which further reduces the leakage. Equilibrium is reached where the leakage cannot increase. Basically, the leakage is used to limit itself.

This embodiment uses the gated VDD solution because the voltage across the circuit is reduced to VDD−SB. This embodiment combines this gated VDD with the modulated back gate bias method because of the source bias SB but only for the NMOS transistors. This is accomplished without switching a lower VDD and driving a well. Thus, a simple process can be used. Also, this embodiment advantageously uses the moderate impedance transistor in a way that causes leakage to limit itself by reaching equilibrium.

Figure 10:
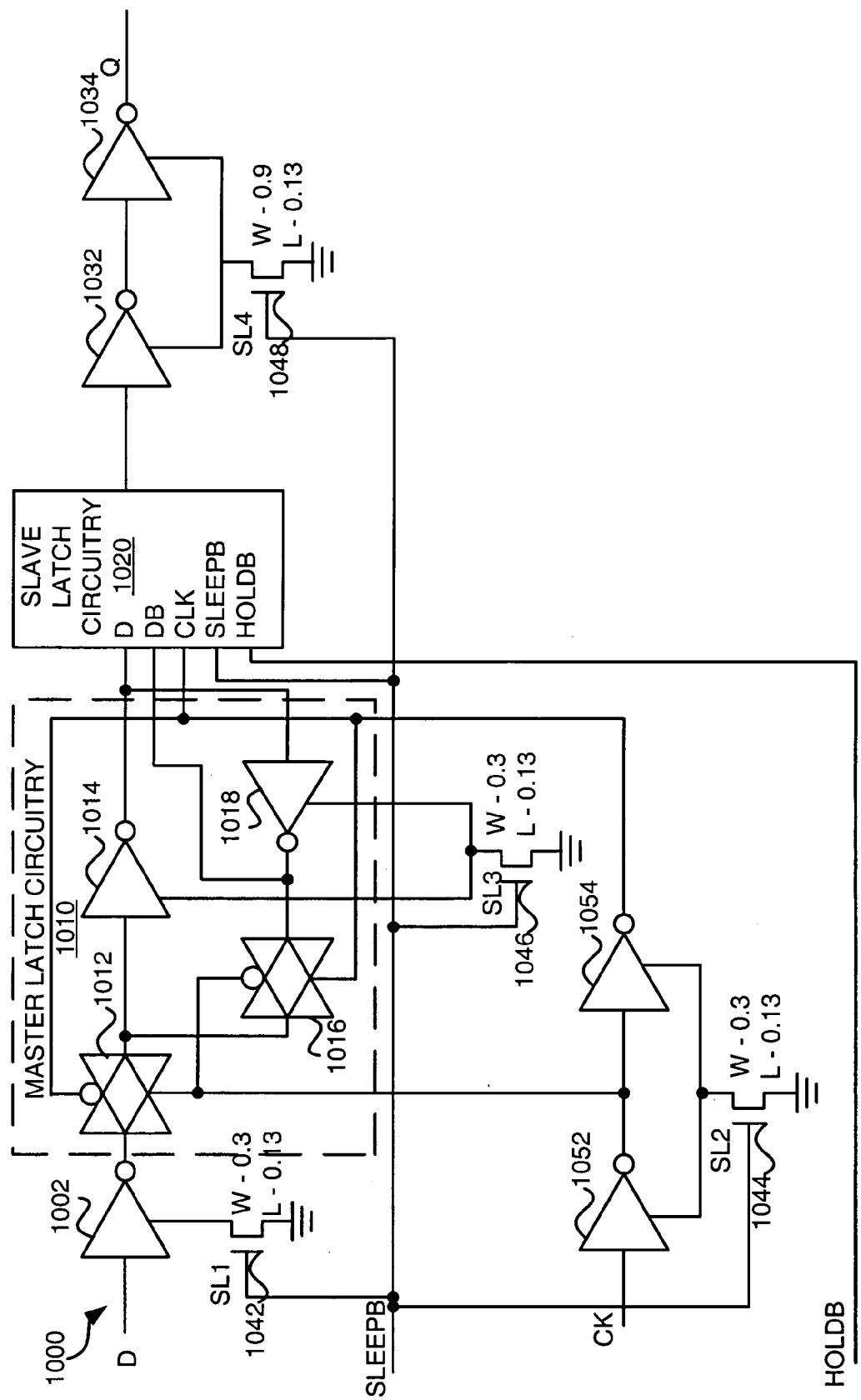
FIG. 10 is an illustration of circuitry for low leakage and data retention in an exemplary implementation of the invention.
Figure 11:
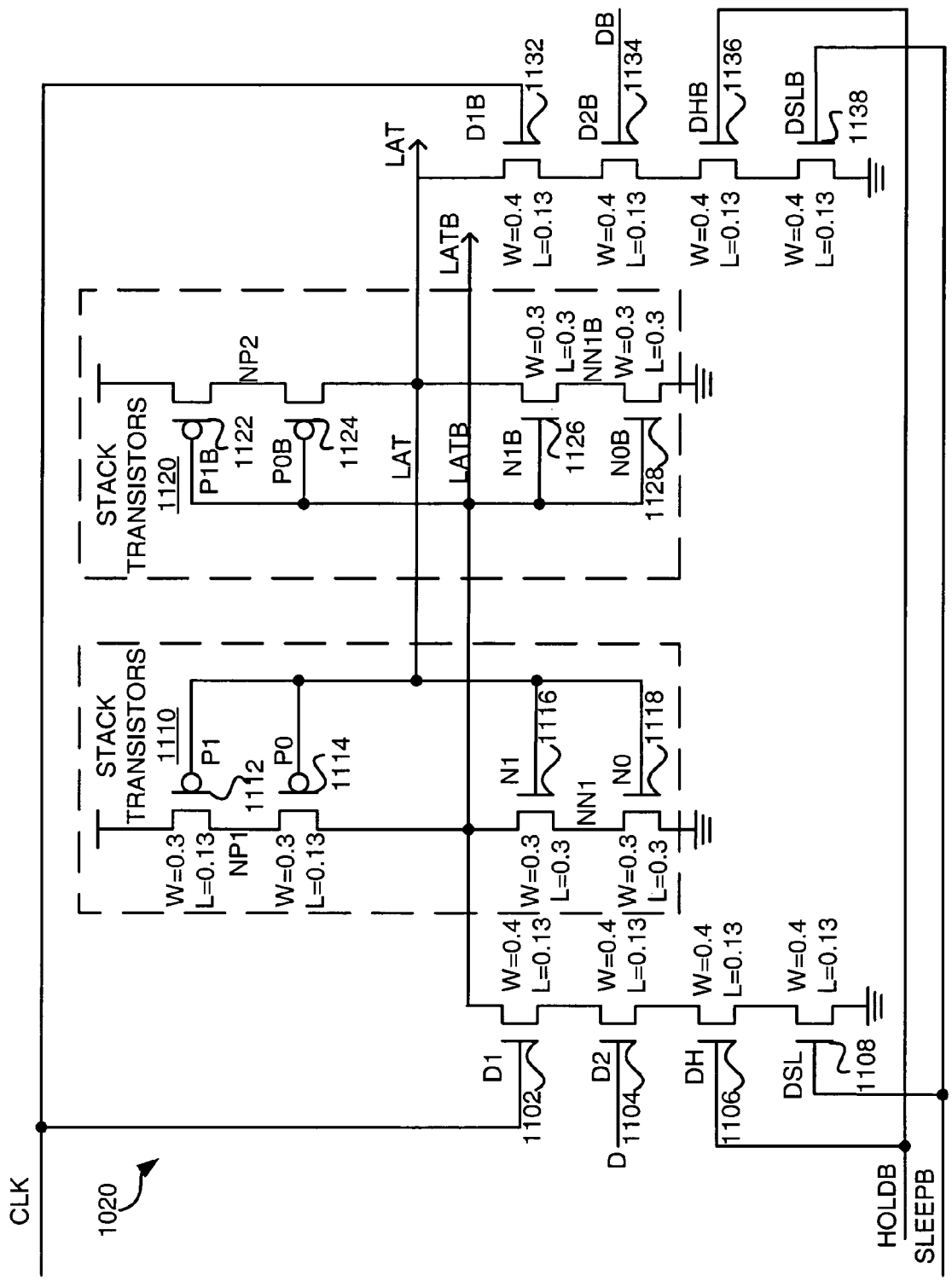
FIG. 11 is an illustration of slave latch circuitry in an exemplary implementation of the invention.

FIGS. 10 and 11 disclose another embodiment for low leakage, data retention circuitry. In this embodiment, in a sleep state, the circuitries that do not require data retention are coupled to ground through a sleep transistor. The logic coupled to the transistors gated by the SLEEPB signal is shut off and draws minimal leakage. This process is accomplished by driving the SLEEPB signal below VSS by 0.3–0.4V. The HOLDB signal keeps the slave latch circuitry from changing state while the rest of the flip-flop comes out of the sleep state. The only part of the flip-flop still powered is the slave latch circuitry. The slave latch circuitry combines several techniques to minimize leakage.

FIG. 10 depicts circuitry 1000 for low leakage and data retention in an exemplary embodiment of the invention. The circuitry 1000 includes the inverter 1002, the master latch circuitry 1010, the slave latch circuitry 1020, the inverter 1032, the inverter 1034, the sleep transistors 1042, 1044, 1046, and 1048, the inverter 1052, and the inverter 1054.

The D input is the input for the inverter 1002. The master latch circuitry 1010 includes the transmission gate 1012, the inverter 1014, the transmission gate 1016, and the inverter 1018. The output of the inverter 1002 is coupled to the left contact of the transmission gate 1012. The right contact of the transmission gate 1012 is coupled to the input of the inverter 1014 and the left contact of the transmission gate 1016. The output of the inverter 1014 is coupled to the D input of the slave latch circuitry 1020 and the input of the inverter 1018. The output of the inverter 1018 is coupled to the DB input of the slave latch circuitry 1020 and the right contact of the transmission gate 1016.

The SLEEPB signal input is coupled to the gates for the SL1 sleep transistor 1042, the SL2 sleep transistor 1044, the SL3 sleep transistor 1046, the SL4 sleep transistor 1048, and the SLEEPB input of the slave latch circuitry 1020. The SL1 sleep transistor 1042 is coupled to the inverter 1002 and ground. The SL2 sleep transistor 1044 is coupled to the inverter 1052, the inverter 1054, and ground. The SL3 sleep transistor 1046 is coupled to the inverter 1014, the inverter 1018, and ground. The SL4 sleep transistor 1048 is coupled to the inverter 1032, the inverter 1034, and ground. In some embodiments, the SL1 sleep transistor 1042, the SL2 sleep transistor 1044, the SL3 sleep transistor 1046, and the SL4 sleep transistor 1048 can each be separated into two or more node each having its own NMOS sleep transistor.

The CK signal is the input of the inverter 1052. The output of the inverter 1052 is coupled to the transmission gate 1012, the transmission gate 1016, and the input of the inverter 1054. The output of the inverter 1054 is coupled to the transmission gate 1012, the transmission gate 1016, and the CLK input of the slave latch circuitry 1020. The HOLDB signal input is coupled to the HOLDB input of the slave latch circuitry 1020. The output of the slave latch circuitry 1020 is coupled to the input of the inverter 1032. The output of the inverter 1032 is coupled to the input of the inverter 1034. The output of the inverter 1034 is the Q signal.

FIG. 11 depicts slave latch circuitry 1020 in an exemplary embodiment of the invention. The slave latch circuitry 1020 includes D1 transistor 1102, D2 transistor 1104, DH transistor 1106, DSL sleep transistor 1108, stack transistors 1110, stack transistors 1120, D1B transistor 1132, D2B transistor 1134, DHB transistor 1136, and sleep transistor 1138.

The D1 transistor 1102, the D2 transistor 1104, the DH transistor 1106, and the DSL sleep transistor 1108 are coupled to each other in series with the sleep transistor 1108 coupled to ground. The gate of the D1 transistor 1102 is coupled to the CLK signal input. The gate of the D2 transistor 1104 is coupled to the D signal input. The gate of the DH transistor 1106 is coupled to the HOLDB signal input. The gate of the sleep transistor 1108 is coupled to the SLEEPB signal input.

The stack transistors 1110 comprise P1 transistor 1112, P0 transistor 1114, N1 transistor 1116, and N0 transistor 1118. The P1 transistor 1112, the P0 transistor 1114, the N1 transistor 1116, and the N0 transistor 1118 are coupled to each other in series with the N0 transistor 1118 coupled to ground. The gates of the P1 transistor 1112, the P0 transistor 1114, the N1 transistor 1116, and the N0 transistor 1118 are coupled to the LAT signal input. The drains of the P0B transistor 1124 and the N1B transistor 1126 are coupled to the LAT signal input.

The stack transistors 1120 comprise P1B transistor 1122, P0B transistor 1124, N1B transistor 1126, and N0B transistor 1128. The P1B transistor 1122, the P0B transistor 1124, the N1B transistor 1126, and the N0B transistor 1128 are coupled to each other in series with the N0B transistor 1128 coupled to ground. The gates of the P1B transistor 1122, the P0B transistor 1124, the N1B transistor 1126, and the N0B transistor 1128 are coupled to the LATB signal input. The drains of the P0 transistor 1114 and the N1 transistor 1116 are coupled to the LATB signal input.

In operation, the logic coupled to the transistors gated by the SLEEPB signal is shut off and draws minimal leakage. This process is accomplished by driving the SLEEPB signal below VSS by 0.3–0.4V. The HOLDB signal keeps the slave latch circuitry 1020 from changing state while the rest of the flip-flop comes out of the sleep state. The only part of the flip-flop still powered is the slave latch circuitry 1020. The slave latch circuitry 1020 combines several techniques to minimize leakage. Transistors not necessary for state retention (stacks with CLK) have sleep transistors to shut off leakage (gated by the SLEEPB signal).

The 8 transistors in the stack transistors 1110 and 1120 use two techniques to reduce leakage. The first technique used is transistor stacking, which is also called self-reverse bias. The N0 transistor 1118 and the N1 transistor 1116 will have some small leakage even when the gate is at 0V. As a result, VNN1 will be at a positive voltage. This causes VGS(N1) and VBS(N1) to be negative, and VDS(N1) to decrease. Consequently, the leakage current is reduced in N0 transistor 1118 and the N1 transistor 1116. The same effect occurs on N0B transistor 1128, N1B transistor 1126, P0 transistor 1114, P1 transistor 1112, P0B transistor 1124, and P1B transistor 1122.

The second technique is called multiple threshold transistors. Increasing channel length of MOS transistors increases the threshold of the devices without any change in process complexity. The N0 transistor 1118, the N1 transistor 1116, the N0B transistor 1128, and the N1B transistor 1126 have increased channel length, which raises VTH and reduces leakage current.

This embodiment reduces leakage by a factor of 25 over a current standard cell D flip-flop.

Figure 12:
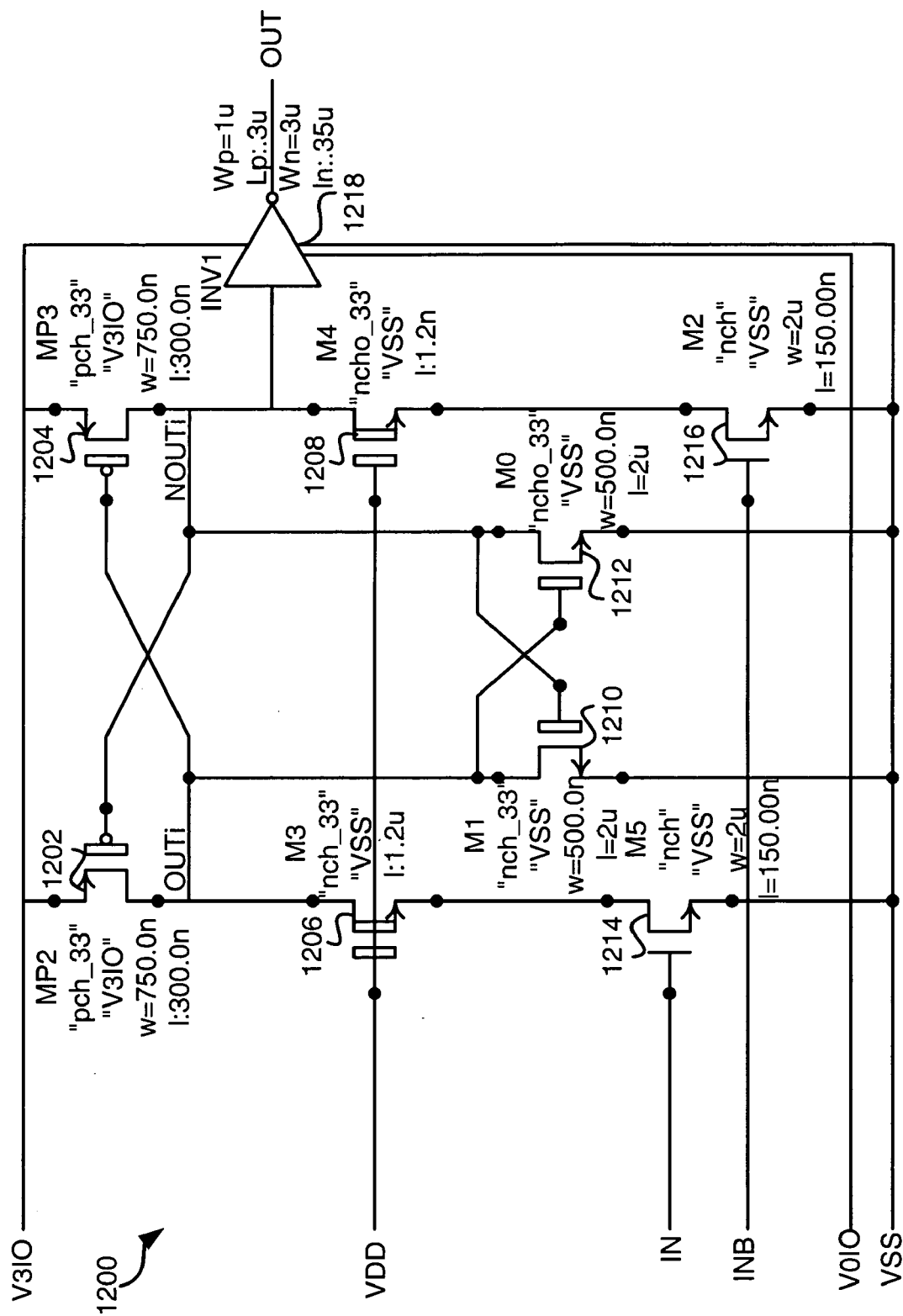
FIG. 12 is an illustration of circuitry for a level shifter for an I/O pad in an exemplary implementation of the invention.

I/O Pad—FIG. 12

In some embodiments, a programmable general purpose input and output (I/O) padcell includes built in-level shifters and isolation that interface with the chip core logic. In these embodiments, a level shifter can be controlled to retain data.

FIG. 12 depicts circuitry 1200 for a level shifter for an I/O pad in an exemplary embodiment of the invention. The circuitry 1200 includes MP2 transistor 1202, MP3 transistor 1204, M3 transistor 1206, M4 transistor 1208, M1 transistor 1210, M0 transistor 1212, M5 transistor 1214, M2 transistor 1216, and an inverter 1218.

The circuitry 1200 is for a latching level shifter. The M3 transistor 1206 and the M4 transistor 1208 are "native" cascode devices. The M3 transistor 1206 and the M4 transistor 1208 are also known as depletion-mode transistors. The M3 transistor 1206 and the M4 transistor 1208 are used to allow thin gate devices to be used in the input stage. This allows large voltage ratios between the VDD and the V3IO. The M0 transistor 1212 and the M1 transistor 1210 are output latching devices that allow the level shifter to retain the state when both IN and INB are 0. Thus, IN and INB control data retention.

In some embodiments, the gates of the M3 transistor 1206 and the M4 transistor 1208 are coupled to other transistors connected to the cascode voltage.

The following truth table is for circuitry 1200.

| IN | INB | OUT |
|----|-----|-----|
| 0  | 0   | Retain last state |
| 0  | 1   | 0 |
| 1  | 0   | 1 |
| 1  | 1   | Illegal |

There will be setup time requirements for any signal compared to SLPB. If level shifters are used with an SRAM cell built into the output stage, the two inputs can be removed anytime after the output latch has flipped to a new state. Both 1.2V inputs to the level shifter cannot go to VDD. This can be prevented by including an inverter. If both the inverter and the level shifter have SLPB transistors, there is a potential timing race if SLPB goes to VSS with VDD high. In this case, the level shifters should be off before the output of the inverter drifts to VDD. In some embodiments, the M5 transistor 1214 and the M2 transistor 1216 can be configured to withstand greater voltages.

In some embodiments, the sources of the M5 transistor 1214 and the M2 transistor 1216 can be coupled to a common SLEEPB transistor to further reduce leakage. In one embodiment, the width of the SLEEPB transistor is 4 micrometers, and the length is 0.13 micrometers. The following truth table is for circuitry 1200 including this common SLEEPB transistor:

| SLEEPB | IN | INB | OUT |
|--------|----|----|------|
| 1 | 0 | 0 | Retain state (Data Retention) |
| 1 | 0 | 1 | 0 |
| 1 | 1 | 0 | 1 |
| 1 | 1 | 1 | Illegal |
| 0 | X | X | Retain State |

In some embodiments, the SLEEPB=0 input state should be understood to include the SLEEPB voltage being below 0V (E.g. −0.35V generated by a leakage optimization circuit).

In this extension to FIG. 12 (and the above truth table), the two Data Retention states may be operated independently, sequentially or simultaneously. This is beneficial when the SLEEPB input is used to control/limit leakage power while the IN/INB=00 state is used for data retention. This is because the SLEEPB voltage comes from a charge pump and takes some time to transition from Vdd (=1) to the Data Retention mode.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. An integrated circuit comprising:
a first circuitry configured to receive input signals, receive a hold signal, process the input signals, retain data in a sleep state that has low leakage, and retain the data based on the hold; and
a sleep transistor circuitry coupled to the first circuitry and configured to receive a sleep signal that has a negative voltage and reduce power consumption of the first circuitry in the state to have low leakage based on the sleep signal while retaining the data in the first circuitry.

2. An integrated circuit comprising:
a first circuitry configured to receive input signals, process the input signals, and retain data in a sleep state that has low leakage, the first circuitry including master latch circuitry and slave latch circuitry, the slave latch circuitry being configured to retain the data in the sleep state; and
a sleep transistor circuitry coupled to the first circuitry and configured to receive a sleep signal that has a negative voltage and reduce power consumption of the first circuitry in the state to have low leakage based on the sleep signal while retaining the data in the first circuitry.

3. The integrated circuit of claim 2 wherein the slave latch circuitry comprises medium impedance transistors configured to bias sources in the slave latch circuitry.

4. The integrated circuit of claim 2 wherein the slave latch circuitry comprises stacked transistors configured to minimize leakage.

5. The integrated circuit of claim 2 wherein the slave latch circuitry comprises multiple threshold transistors configured to minimize leakage.

6. An integrated circuit comprising:
a first circuitry located within a power island and configured to receive input signals, process the input signals, and retain data in a sleep state that has low leakage; and
a sleep transistor circuitry coupled to the first circuitry and configured to receive a sleep signal that has a negative voltage and reduce power consumption of the first circuitry in the state to have low leakage based on the sleep signal while retaining the data in the first circuitry.

7. An integrated circuit comprising:
a first circuitry configured to receive input signals, process the input signals, and retain data in a sleep state that has low leakage;
a sleep transistor circuitry coupled to the first circuitry and configured to receive a sleep signal that has a negative voltage and reduce power consumption of the first circuitry in the state to have low leakage based on the sleep signal while retaining the data in the first circuitry; and an adaptive leakage controller configured to determine the negative voltage of the sleep signal.

8. An integrated circuit comprising:
a first circuitry configured to receive a control signal to deactivate a sleep state, receive input signals, process the input signals, and retain data in the sleep state that has low leakage; and
a sleep transistor circuitry coupled to the first circuitry and configured to receive a sleep signal that has a negative voltage and reduce power consumption of the first circuitry in the state to have low leakage based on the sleep signal while retaining the data in the first circuitry.

9. A method for operating an integrated circuit, the method comprising:
receiving input signals into first circuitry;
processing the input signals in the first circuitry;
retaining data in a sleep state that has low leakage in the first circuitry;
receiving a sleep signal that has a negative voltage into sleep transistor circuitry coupled to the first circuitry;
in the sleep transistor circuitry, reducing power consumption of the first circuitry in the sleep state to have low leakage based on the sleep signal while retaining the data in the first circuitry;
receiving a hold signal into the first circuitry; and
retaining the data based on the hold signal.

10. A method for operating an integrated circuit, the method comprising:
receiving input signals into first circuitry that includes master latch circuitry and slave latch circuitry;
processing the input signals in the first circuitry;
retaining data in a sleep state that has low leakage in the first circuitry;
receiving a sleep signal that has a negative voltage into sleep transistor circuitry coupled to the first circuitry;
in the sleep transistor circuitry, reducing power consumption of the first circuitry in the sleep state to have low leakage based on the sleep signal while retaining the data in the first circuitry; and
in the slave latch circuitry, retaining the data in the sleep state.

11. The method of claim 10 further comprising minimizing leakage using a medium impedance transistor to bias sources in the slave latch circuitry.

12. The method of claim 10 further comprising minimizing leakage using stacked transistors in the slave latch circuitry.

13. The method of claim 10 further comprising minimizing leakage using multiple threshold transistors in the slave latch circuitry.

14. The method of claim 10 wherein the first circuitry is located within a power island.

15. A method for operating an integrated circuit, the method comprising;
receiving input signals into first circuitry;
processing the input signals in the first circuitry;
retaining data in a sleep state that has low leakage in the first circuitry;
receiving a sleep signal that has a negative voltage into sleep transistor circuitry coupled to the first circuitry;
in the sleep transistor circuitry, reducing power consumption of the first circuitry in the sleep state to have low leakage based on the sleep signal while retaining the data in the first circuitry; and
determining a negative voltage of the sleep signal in an adaptive leakage controller.

16. A method for operating an integrated circuit, the method comprising:
receiving input signals into first circuitry;
processing the input signals in the first circuitry;
retaining data in a sleep state that has low leakage in the first circuitry;
receiving a sleep signal that has a negative voltage into sleep transistor circuitry coupled to the first circuitry;
in the sleep transistor circuitry, reducing power consumption of the first circuitry in the sleep state to have low leakage based on the sleep signal while retaining the data in the first circuitry; and
receiving a control signal to deactivate the sleep state in the first circuitry.

* * * * *